US006840666B2

(12) United States Patent
Enachescu et al.

(10) Patent No.: US 6,840,666 B2
(45) Date of Patent: Jan. 11, 2005

(54) METHODS AND SYSTEMS EMPLOYING INFRARED THERMOGRAPHY FOR DEFECT DETECTION AND ANALYSIS

(75) Inventors: Marian Enachescu, Richmond, CA (US); Sergey Belikov, Palo Alto, CA (US)

(73) Assignee: Marena Systems Corporation, Hayward, CA (US)

( * ) Notice: Subject to any disclaimer, the term of this patent is extended or adjusted under 35 U.S.C. 154(b) by 0 days.

(21) Appl. No.: 10/348,940

(22) Filed: Jan. 22, 2003

(65) Prior Publication Data

US 2003/0137318 A1 Jul. 24, 2003

Related U.S. Application Data

(60) Provisional application No. 60/350,074, filed on Jan. 23, 2002, and provisional application No. 60/350,055, filed on Jan. 23, 2002.

(51) Int. Cl.[7] ......................... G01N 25/72; G01R 31/02; G01R 31/3183
(52) U.S. Cl. ......................... 374/5; 374/124; 324/501; 324/765; 324/770; 382/149; 250/341.4; 250/341.6
(58) Field of Search ......................... 250/341.1, 341.4, 250/341.6, 342; 374/4, 5, 57, 121, 124; 324/770, 750, 752, 765, 501; 382/149, 151; 345/87–90, 92, 93, 904, 207, 211–214

(56) References Cited

U.S. PATENT DOCUMENTS

| | | | | |
|---|---|---|---|---|
| 3,991,302 A | | 11/1976 | Danner | 235/151.31 |
| 4,733,175 A | * | 3/1988 | Levinson | 374/124 |
| 4,755,874 A | | 7/1988 | Esrig et al. | 382/149 |
| 5,032,727 A | * | 7/1991 | Cox et al. | 374/5 |
| 5,208,528 A | * | 5/1993 | Quintard | 250/341.6 |
| 5,250,931 A | * | 10/1993 | Misawa et al. | 345/92 |
| 5,294,198 A | | 3/1994 | Schlagheck | 374/4 |
| 5,309,108 A | | 5/1994 | Maeda et al. | 324/501 |
| 5,495,535 A | | 2/1996 | Smilansky et al. | 382/145 |
| 5,504,438 A | | 4/1996 | Henley | 324/770 |
| 5,740,272 A | | 4/1998 | Shimada | 382/149 |
| 5,774,573 A | | 6/1998 | Caspi et al. | 382/141 |
| 5,775,806 A | * | 7/1998 | Allred | 374/5 |
| 5,982,945 A | | 11/1999 | Neff et al. | 382/271 |

(List continued on next page.)

OTHER PUBLICATIONS

"Thermography Receives a Warm Welcome from Microelectronics Industry," by Doug Little. EE–Evaluation Engineering, Aug. 1999. 3 pages.

"Thermography in the Microelectronics Industry," by Chris Alicandro and Doug Little. EE–Evaluation Engineering, Aug. 1999. 2 pages.

*Primary Examiner*—Diego Gutierrez
*Assistant Examiner*—Stanley J. Pruchnic, Jr.
(74) *Attorney, Agent, or Firm*—Silicon Edge Law Group LLP; Arthur J. Behiel

(57) ABSTRACT

Described are methods and systems for providing improved defect detection and analysis using infrared thermography. Test vectors heat features of a device under test to produce thermal characteristics useful in identifying defects. The test vectors are timed to enhance the thermal contrast between defects and the surrounding features, enabling IR imaging equipment to acquire improved thermographic images. In some embodiments, a combination of AC and DC test vectors maximize power transfer to expedite heating, and therefore testing. Mathematical transformations applied to the improved images further enhance defect detection and analysis. Some defects produce image artifacts, or "defect artifacts," that obscure the defects, rendering difficult the task of defect location. Some embodiments employ defect-location algorithms that analyze defect artifacts to precisely locate corresponding defects.

19 Claims, 14 Drawing Sheets

U.S. PATENT DOCUMENTS

| | | | |
|---|---|---|---|
| 6,111,424 A | 8/2000 | Bosacchi | 324/770 |
| 6,269,194 B1 | 7/2001 | Nichani | 382/270 |
| 6,288,782 B1 | 9/2001 | Worster et al. | 356/394 |
| 6,289,492 B1 | 9/2001 | Dutta-Choudhury et al. | 716/5 |
| 6,381,355 B1 | 4/2002 | Goonetilleke | 382/141 |
| 6,381,372 B1 | 4/2002 | Loce | 382/261 |
| 6,389,163 B1 | 5/2002 | Jodoin et al. | 382/173 |
| 6,411,731 B1 | 6/2002 | Saito | 382/173 |
| 6,456,899 B1 | 9/2002 | Gleason et al. | 700/212 |
| 6,714,017 B2 * | 3/2004 | Meier et al. | 324/501 |
| 2002/0093354 A1 * | 7/2002 | Enachescu et al. | 324/760 |

* cited by examiner

METHODS AND SYSTEMS EMPLOYING INFRARED THERMOGRAPHY FOR DEFECT DETECTION AND ANALYSIS

This application claims benefit of Ser. No. 60/350,074 filed Jan. 23, 2000 and claims benefit of Ser. No. 60/350,055 filed Jan. 23, 2002.

BACKGROUND

Electrical circuits, such as printed circuit boards (PCBs), integrated circuits, and flat-panel displays (FPDs), may be tested for defects using infrared (IR) thermography. In general, power is applied to a device under test (DUT) to heat various of the device features. An infrared detector then captures a test image of the heated DUT. The resulting image, a collection of pixel-intensity values spatially correlated to the imaged object, is then compared with a similar collection of reference image data. Differences between the test and reference data, typically stored as a "composite image," indicate the presence of defects.

Defect identification algorithms analyze composite images to automatically identify defects, and consequently improve throughput and quality in device manufacturing. Examples of such inspection systems include, but are not limite to, inspection of FPDs, PCBs, MEMS-based devices, semiconductor devices, and biomedical specimen. One purpose of such systems is to test for defects potentially present on a device at some critical point during manufacture of that device. Once identified, the defects can then be repaired by a repair system, or a choice can be made to reject the device, leading to manufacturing cost savings in both cases. Other applications include inspection and identification of artifact-like features in research specimens, e.g. in biology.

One particularly important use of IR thermography is the testing of the active layer, or "active plate," of liquid-crystal display (LCD) panels. Defect analysis can be used to improve processing and increase manufacturing yield. Also important, defective panels can be repaired, provided the number and extent of defects are not too great, again increasing manufacturing yield.

FIG. 1 (prior art) depicts portions of an active plate 100 for use with an LCD panel. (FIG. 1 was taken from U.S. Pat. No. 6,111,424 to Bosacchi, which issued Aug. 29, 2000, and is incorporated herein by reference.) Active plate 100 includes a first shorting bar 105 connected to each pixel in an array of pixels 110 via a collection of source lines 115 and a second shorting bar 120 connected to each pixel 110 via a collection of gate lines (control lines) 125.

According to Bosacchi, active plate 100 is tested by evaluating the IR emission of active plate 100 with voltage applied to shorting bars 105 and 120. With power thus applied, portions of plate 100 operate as resistive circuits, and consequently dissipate heat. The heating response characteristics of plate 100 are then evaluated, preferably after plate 100 reaches a stable operating temperature (thermal equilibrium).

In the absence of defects, the pixel array should heat up uniformly. Non-uniform thermal characteristics, identified as aberrant IR intensity values, therefore indicate the presence of defects. Reference intensity values can be obtained by averaging the pixel intensity values of a given image frame, or by means of a reference frame corresponding to an ideal or defect-free reference plate.

FIG. 2 (prior art) details a portion of a conventional pixel 110, and is used here to illustrate a number of potential defects. The depicted features of pixel 110 are associated with the active plate of a liquid-crystal display, and include a thin-film transistor 200 having a first current-handling terminal connected to one of source lines 115, a control terminal connected to one of gate lines 125, and a second current-handling terminal connected to a capacitor 210. The second electrode of capacitor 210 connects to a common line 212. Pixel 110 also includes a second capacitor 211 having a liquid-crystal dielectric.

The defects, which are illustrative and not exhaustive, include both shorts and opens. The shorts are between: source line 115 and gate line 125 (short 215) or common line 212 (short 216); the two current-handling terminals of transistor 200 (short 220); the gate and second current-handling terminal of transistor 200 (short 225); and the two terminals of capacitor 210 (short 226). The opens segment the source, gate, and common lines (opens 227, 228, and 229), and are between: source line 115 and transistor 200 (open 230), gate line 125 and the control terminal of transistor 200 (open 232), capacitor 210 and common line 212 (open 235), and transistor 200 and capacitor 210 (open 233).

Each defect of FIG. 2, plus a number of others, adversely impacts the operation of pixel 110. Unfortunately, many of these defects are difficult to discover using conventional test methods. There is therefore a need for improved methods and systems for identifying and locating defects.

Some inspection systems include an excitation source that excites the object under test in a way that highlights defects to an imaging system. The type of excitation depends upon the imaging system, which may acquire images based on visible light, infrared, combined spectroscopy, magnetic fields, etc. Whatever imaging system is employed, test images of the object under test are contrasted with some reference image to obtain a composite image: significant differences between the test and reference images show up in the composite image, and identify potential defects.

Some forms of excitation produce defect artifacts, which are differences between test and reference images that are caused by defects but that do not physically correlate to defect areas. A short between two lines increases current through those lines, and consequently elevates the temperatures of the lines along with the short. Thus the lines, though not themselves defective, nevertheless appear with the short in the composite image. The defect data representing the short is thus imbedded within defect-artifact data (i.e., a "defect artifact"). Defect artifacts often obscure the associated defects, rendering them difficult to precisely locate. Human operators can locate a defect within a defect artifact by careful study under a microscope, but people are relatively slow and are quickly fatigued. There is therefore a need for means of automatically distinguishing defects from their related artifacts.

DETAILED DESCRIPTION

Figure 1:
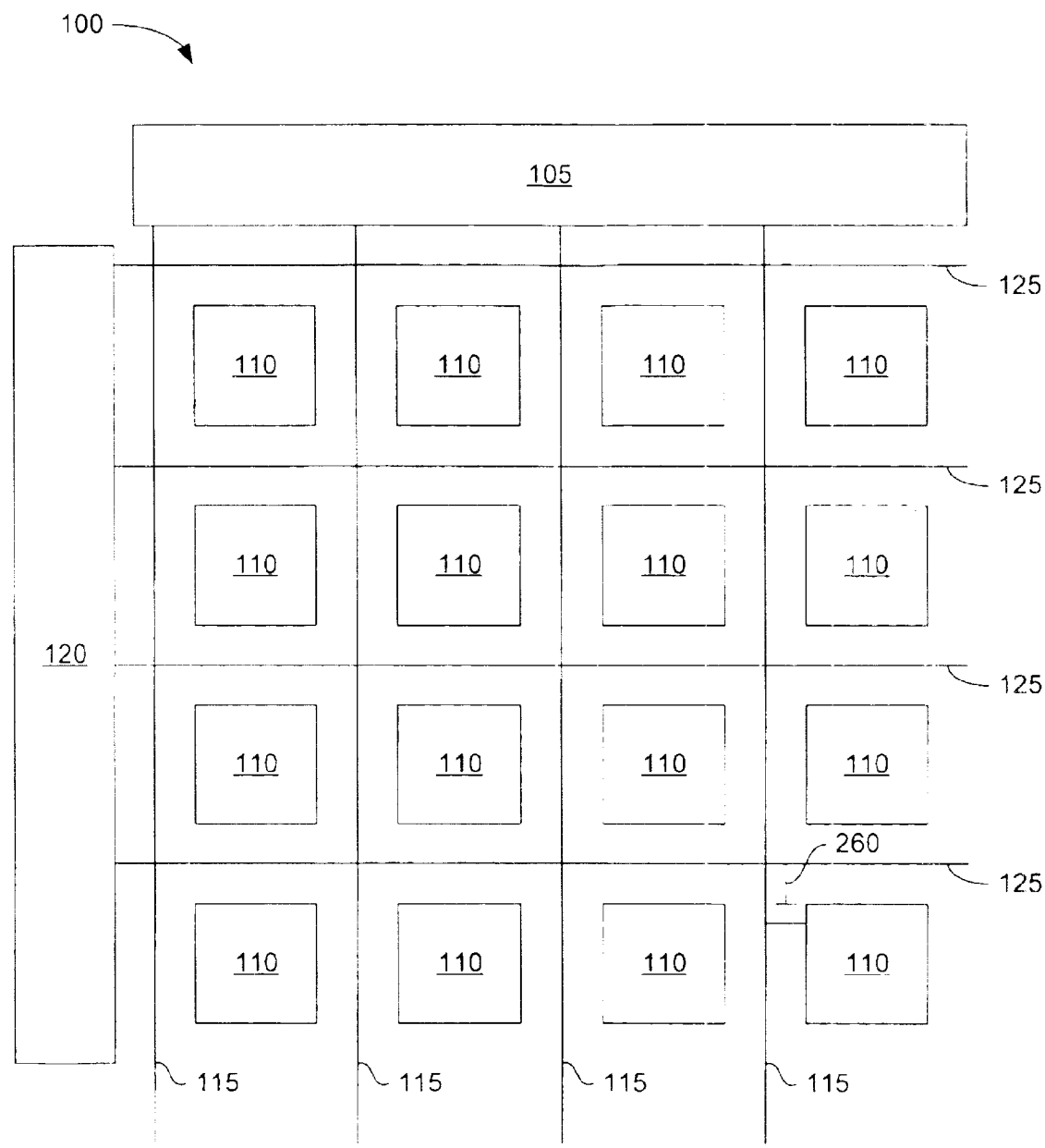
FIG. 1 (prior art) depicts portions of an active plate 100 for use with an LCD panel.
Figure 2:
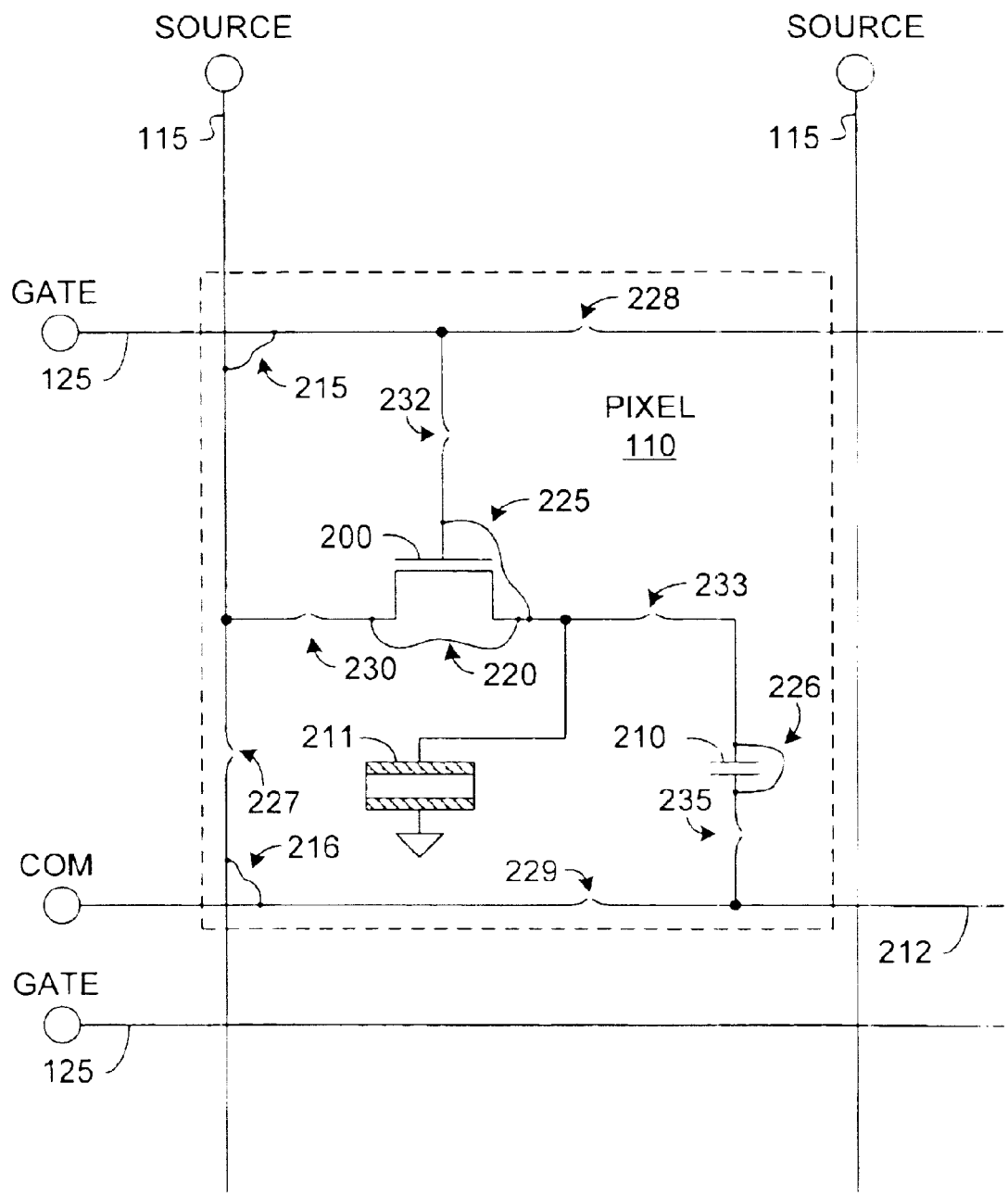
FIG. 2 (prior art) details an exemplary pixel 110, and is used here to illustrate a number of potential defects.
Figure 3:
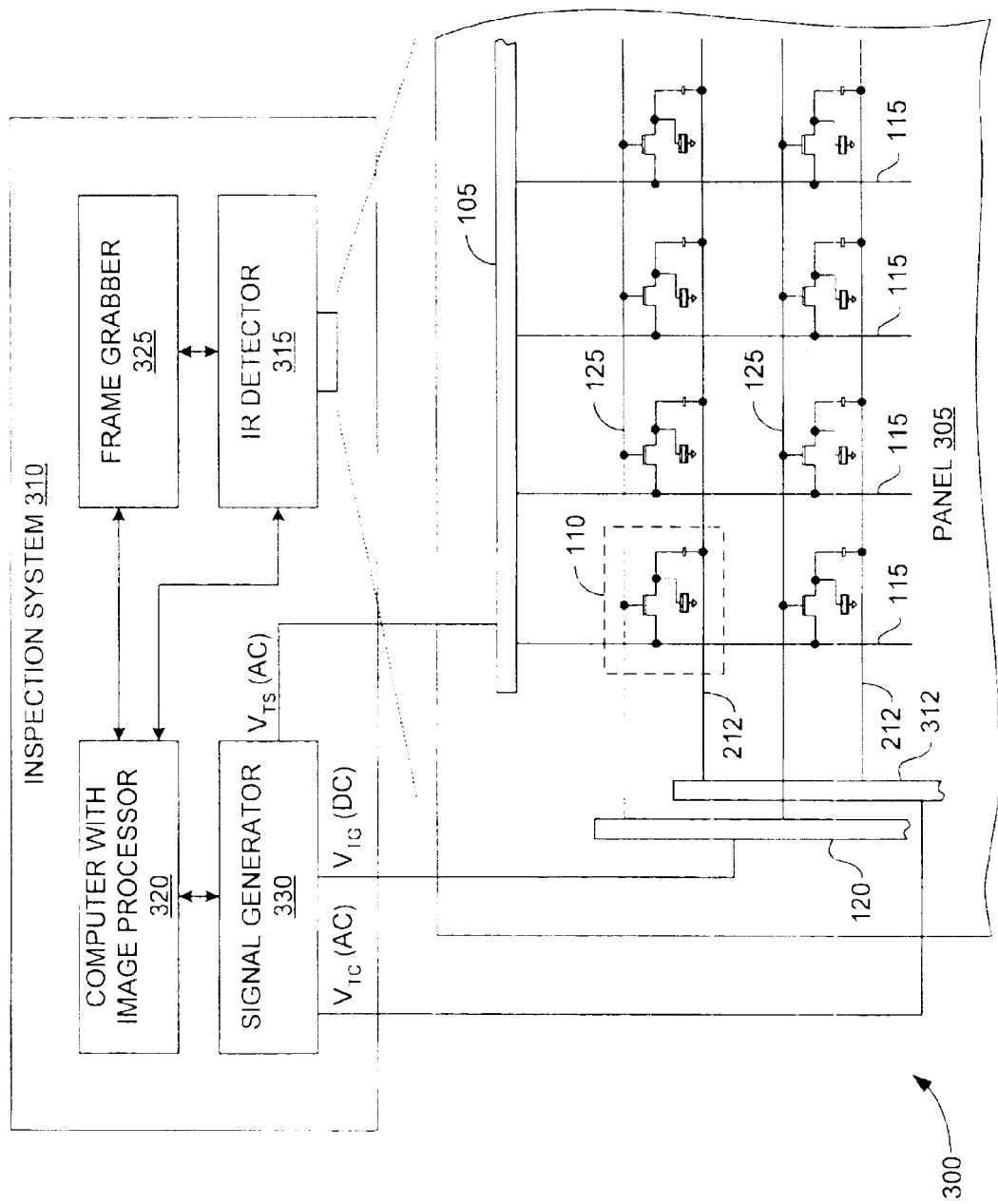
FIG. 3 depicts a test configuration 300, including a conventional panel 305 and an inspection system adapted in accordance with an embodiment of the invention.

FIG. 3 depicts a test configuration 300, including a conventional panel 305 and an inspection system 310 adapted in accordance with an embodiment of the invention. Panel 305 is similar to panel 100 of FIGS. 1 and 2, like-numbered elements being the same or similar. Panel 305 includes a shorting bar 312 that is not depicted in FIG. 1, but is nevertheless conventional. Inspection system 310 includes an IR detector 315 (e.g., an IR camera) oriented over panel 305 to provide image data to a computer 320 via a frame grabber 325. An excitation source, signal generator 330, provides electrical test signals, or "test vectors," to panel 310. The test vectors heat features of panel 310 to produce thermal characteristics useful in identifying defects.

Computer 325 controls signal generator 330 to apply test vectors to panel 305. These test vectors enhance the thermal contrast between defects and the surrounding features, and consequently allow IR detector 315 to acquire improved thermographic images for defect detection and analysis. Computer 320 additionally instructs IR detector 315 when to acquire image data, receives and processes captured test-image data from frame grabber 325, and provides a user interface (not shown).

IR detector 315 should have excellent temperature sensitivity. In one embodiment, detector 315 is an IR Focal-Plane Array Thermal Imaging Camera employing a 256×320 element InSb (Indium Antimonide) detector. The minimum temperature sensitivity of this camera is less than 0.020 degrees C. Some embodiments include multiple IR detectors, for example a relatively low magnification IR camera for defect detection and a higher magnification IR camera for defect detection and analysis. Additional cameras might also be used to increase inspection area, and thus inspection bandwidth.

Signal generator 330 provides a source test vector $V_{TS}$ to shorting bar 105, a gate test vector $V_{TG}$ to shorting bar 120, and a common test vector $V_{TC}$ to shorting bar 312. Referring back to FIG. 2, testing for some types of defects (e.g., opens 230, 233, and 235) requires transistor 200 be turned on to create a signal path between respective source and common lines 115 and 212. Signal generator 330 thus applies a DC test vector $V_{TG}$ to gate line 125 (via shorting bar 120), thus turning transistor 200 on, while applying the source and common test vectors $V_{TS}$ and $V_{TC}$.

Even with transistor 200 forward biased, a non-defective pixel 110 will not pass direct current, absent short 226, because capacitor 210 blocks direct current. The source and common test vectors $V_{TS}$ and $V_{TC}$ are therefore selected to produce an AC signal that passes through capacitor 210. The frequency of the AC signal is matched to the impedance of the load provided by panel 305 to maximize power transfer to panel 305, which expedites heating, and therefore testing. Maximizing power transfer also allows for testing with lower applied voltages, which are less likely to damage sensitive components. Also important, as detailed below, a combination of faster heating and specific image-capture timing provides improved thermal contrast. In one embodiment, source test vector $V_{TS}$ oscillates from zero to 30 volts at about 70 KHz and common test vector $V_{TC}$ is ground potential.

Some embodiments apply either AC or DC test vectors between source line 115 and common line 212, source line 115 and gate line 125, and between gate line 125 and common line 212. Still other embodiment employ AC signals to turn transistor 200 on. The simultaneous application of AC and DC test vectors, as detailed above, facilitates more comprehensive testing than is obtained by application of only one type of waveform (e.g., only DC, AC, or pulsed DC test vectors).

Figure 4:
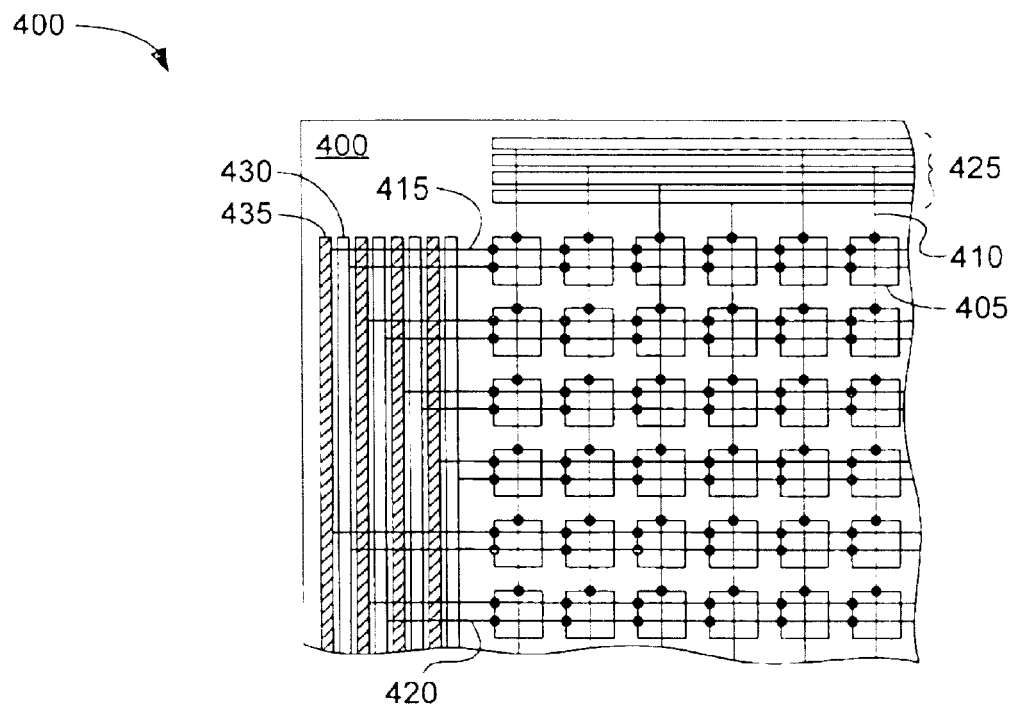
FIG. 4 depicts a portion of a panel 400 adapted in accordance with one embodiment to provide enhanced testability.

FIG. 4 depicts a portion of a panel 400 adapted in accordance with one embodiment to provide enhanced testability. Panel 400 conventionally includes an array of pixels 405, each connected to a source line 410, a gate line 415, and a common line 420. Four sets of shorting bars (source bars 425, gate bars 435, and common bars 430) allow inspection systems, such as that of FIG. 3, to test subsets of pixels 405. Alternatively, four sets of one type of bar (e.g., four source bars or four gate bars) can be used to energize selected columns or rows. Energizing some features while leaving adjacent features de-energized can improve image contrast. In other embodiments, only one or two types of shorting bars are provided in sets. There may only be one gate bar 435 and one common bar 430, for example, in which case pixels 405 can be excited in four sets of columns. Moreover, one or more sets of shorting bars can include more or fewer than four shorting bars.

Figure 5:
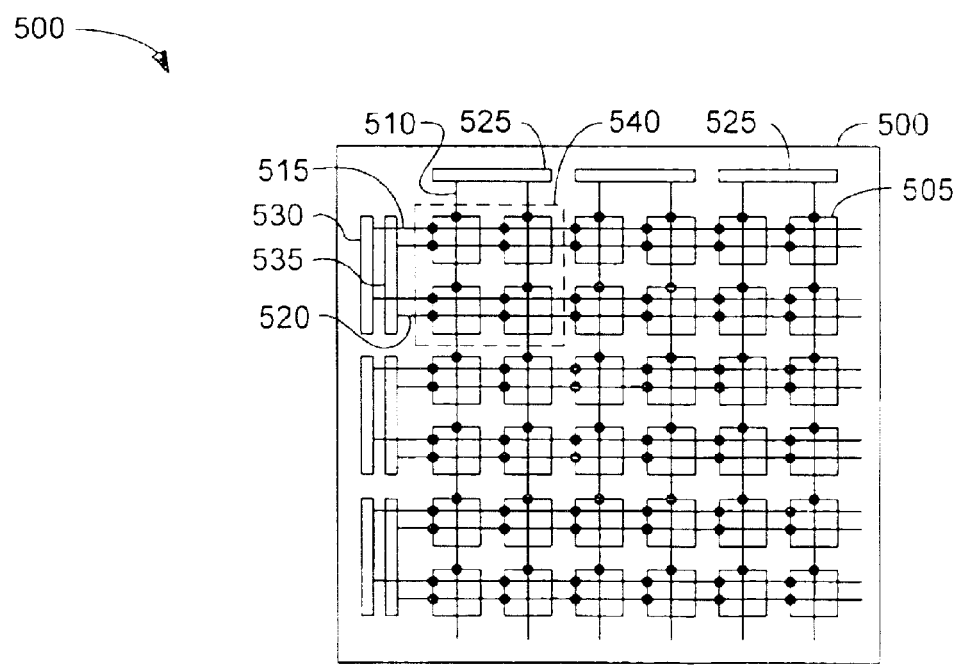
FIG. 5 depicts a portion of an LCD panel 500 adapted in accordance with one embodiment.

FIG. 5 depicts a portion of an LCD panel 500 adapted in accordance with another embodiment. Panel 500 conventionally includes an array of pixels 505, each connected to a source line 510, a gate line 515, and a common line 520. Source bars 525, gate bars 530, and common bars 535 are segmented to allow an inspection system to power test areas (e.g., area 540) one at a time. Alternatively, fewer types of bars need be segmented. For example, the common bar need not be segmented to power area 540 if the source and gate bars are segmented. Area 540 might be coextensive with the field of view of the IR detector used to capture images. The number of pixels 505 in a given area is generally much greater than depicted in this simple example.

Figure 6A:
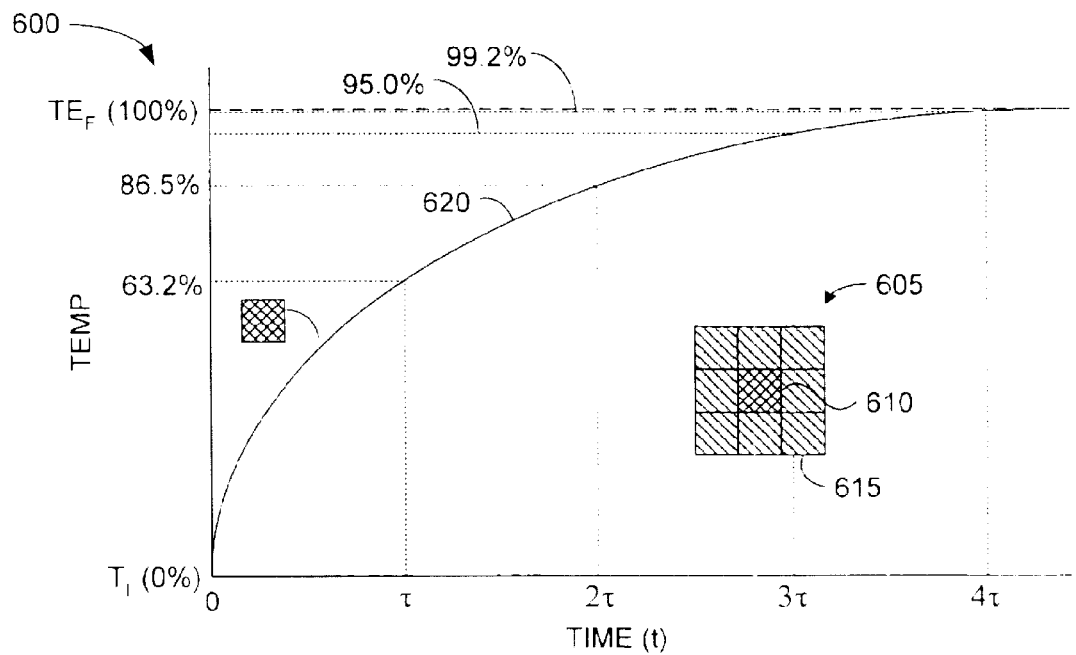
FIG. 6A is a diagram 600 illustrating the thermal response of the above-described sample defect and the surrounding area.

FIG. 6A is a diagram 600 illustrating the thermal response of an illustrative sample defect and the surrounding area. The sample defect is assumed to be a short having a resistance R of about twenty-five thousand ohms, a volume V of the combined defect and associated electrodes of about $10^{-12}$ m$^3$, and an exposed suface area A of about $10^{-5}$ m$^2$. The specific heat Cp of the electrodes is assumed to be about $2.44 \times 10^6$ J/m$^3$K, and the convection heat transfer coefficient of the surrounding air $h_{air}$ is about 10 W/m$^2$K. For an applied power of about 6 milliwatts the equilibrium temperature at the defect location is about 6.5 degree C. above the initial temperature. The following heat transfer model illustrates the thermal response of the sample defect in response to applied power:

$$VC_p \frac{dT(t)}{dt} = \frac{U(t)^2}{R} - h_{air}A(T(t) - T_{air}) \qquad (1)$$

where:
1. V is the volume of the combined defect and associated electrodes;
2. Cp is the average specific heat of the defect and associated electrodes;
3. T(t) is temperature, in Kelvin, of the defect over time, in seconds;
4. $P_{applied}(t)$ is the applied power excitation over time, in seconds;
5. $h_{air}$ is the convection heat transfer coefficient of the surrounding air;
6. A is the exposed surface area of the combined defect and associated electrodes; and
7. $T_{air}$ is the temperature of the surrounding air or initial temperature (e.g., about 300K).

Equation (1) means, in essence, that the power applied to the defect area is, at a given instant, equal to the sum of the power absorbed by the defect area and the power dissipated into the surrounding environment. Initially, when the temperature difference between the defect area and surrounding environment is nominal, the first added dominates the equation. The second addend gains influence as the temperature of the defect area rises.

A diagram 605 illustrates the sample defect area 610 and surrounding area 615 as a collection of boxes, each box representing the image intensity recorded by an image pixel. For ease of illustration, diagram 605 illustrates defect area 610 as a single pixel. Diagram 600 assumes about six milliwatts is applied between the source and gate lines for a time sufficient for defect area 610—a short between the source and gate lines—to rise from an initial thermal equilibrium temperature $T_I$ of about 300K to a final equilibrium temperature $TE_F$ of about 306.5K. Under the specified conditions, traversing this temperature window takes about 0.1–0.2 seconds for a typical active plate.

A first response curve 620 illustrates the thermal response of defect area 610. The vertical axis of diagram 600 represents temperature as a percentage of the temperature span between initial temperature $T_I$ and final equilibrium temperature $TE_F$ of response curve 620. The horizontal axis represents time, in thermal time constants τ. The thermal time constant τ is the time required for the temperature of defect area 610 to rise 63.2% of the way from a given temperature to final equilibrium temperature $TE_F$. For practical purposes, the defect temperature is at the final equilibrium temperature $TE_F$ after four or five time constants τ.

The thermal response of area 615 surrounding defect area 610 differs from the thermal response of defect area 610. If the defect is a short, heat from area 610 diffuses into area 615, causing the temperature of area 615 to rise with defect 610. The rising temperature of area 615 lags that of defect 610, however, and rises to a lower final thermal equilibrium temperature than defect 610. Test vectors applied in accordance with some embodiments provide increased temperature contrast between areas 610 and 615 to allow IR imaging systems to more easily resolve defect features. IR inspection systems then employ unique image-acquisition timing to capture test image data well before defect area 610 reaches final equilibrium temperature $TE_F$. (If defect area 610 is an open, the temperature of area 610 lags surrounding area 615, but nevertheless eventually reaches a final equilibrium temperature.)

Figure 6B:
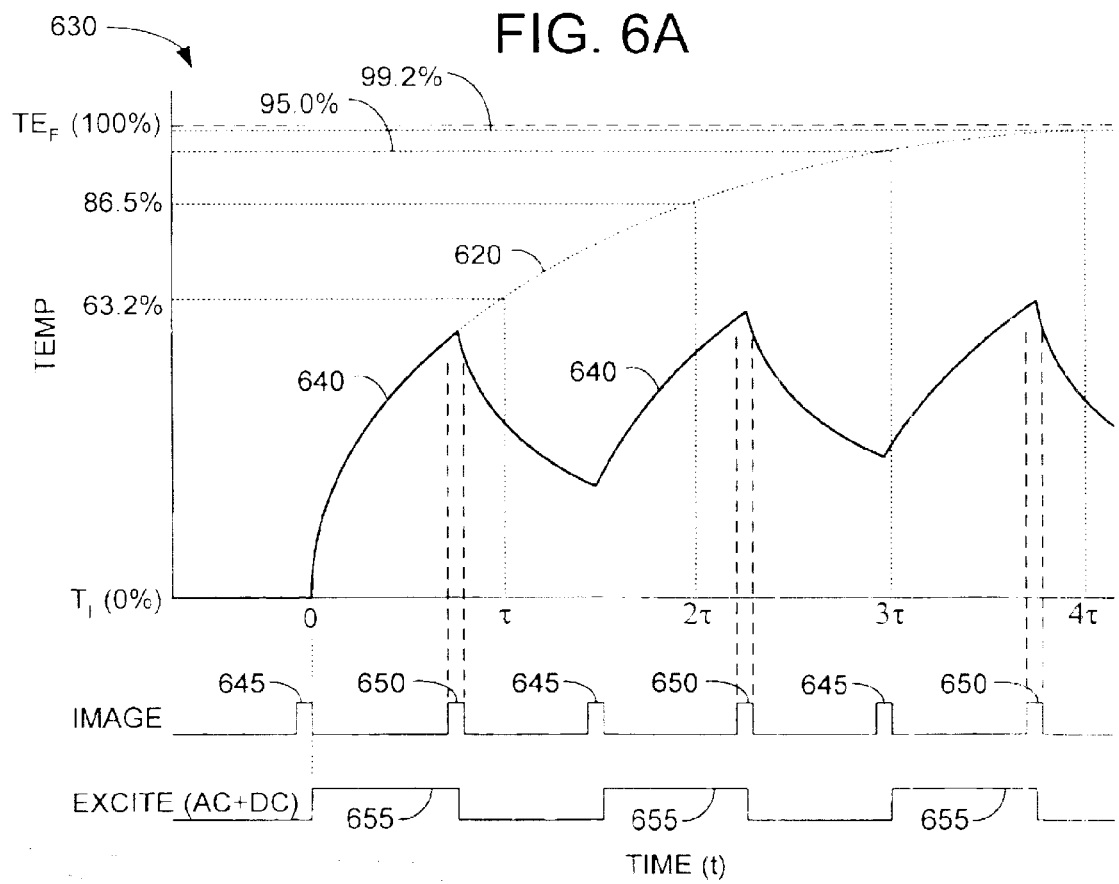
FIG. 6B depicts a diagram 630 illustrating the thermal response of sample defect 610.

FIG. 6B includes a diagram 630 illustrating test vectors and image-acquisition timing that enhance thermal contrast between defects and the surrounding areas. Diagram 630 includes a thermal response curve 640 representing the repetitive heating and cooling of defect area 610 in response to test vectors. FIG. 6B additionally includes a pair of waveforms IMAGE and EXCITE that share a common time scale with diagram 630. The high portions of waveform IMAGE represent windows of time during which IR images of areas 610 and 615 are captured. One or more reference images are captured during each reference window 645, while one or more test images are captured during each test window 650. The high portions 655 of waveform EXCITE represent times during which test vectors are applied to defect 610 to introduce thermal contrast between defect 610 and surrounding area 615.

To capture test images, an inspection system (e.g. inspection system 310 of FIG. 3) applies test vectors to a device under test during times 655. The inspection system then captures one or more IR images of the defect area well before the features of interest reach the final thermal equilibrium temperature $TE_F$.

It is desirable to keep the maximum temperature (i.e., the peaks of response curve 640) below 95% of the difference between the initial temperature $T_I$ and the final equilibrium temperature $TE_F$. In some cases, the maximum temperature may even endanger DUT functionality. The optimal upper limit for temperature thus varies for different DUTs, test procedures, etc., but is preferably less than 86.5% in many cases. Our experimental data suggest that excellent results are obtained when the maximum temperature does not exceed about 63.5% of the difference between the initial temperature $T_I$ and the final equilibrium temperature $TE_F$ (i.e., before the passage of one time constant). The heating/imaging steps are repeated a number of times, and the results averaged or otherwise combined, to reduce the effects of noise. The maximum and minimum peaks of response curve 640 should be sufficiently spaced for the selected detector to resolve the temperature difference.

Defect 610 can be heated to higher temperatures, for more than three or four time constants, for example; in such cases, the images can still be taken well before defect 610 reaches the final equilibrium temperature $TE_F$. Because heating takes time, selecting relatively low maximum temperatures speeds testing. Moreover, the test voltages selected to maximize image contrast may, if applied too long, raise the temperatures of areas 610 and 615 high enough to damage sensitive components. In such cases, the test vectors are applied long enough to achieve a desired level of thermal contrast without raising the temperatures of areas 610 and 615 above some maximum temperature.

The applied test vectors differ depending in part on the DUT. In one embodiment suitable for testing an active panel from a liquid-crystal display (LCD) having SXGA resolution, the low portions of the EXITE waveform represent periods of about 20 ms when no test vectors are applied, and the high portions 655 represent periods of about 20 ms during which time AC source and common test vectors oscillate from zero to 30 volts at about 70 KHz.

Conventional infrared imaging systems represent images using arrays of numbers, each number representing a pixel intensity value. Each pixel intensity value, in turn, represents the image intensity of a corresponding area of the DUT. In inspection system 310 of FIG. 3, for example, frame grabber 325 delivers to computer 320 an array of pixel intensity values for each captured image.

Some conventional inspection systems average sequences of images to reduce the effects of noise. Averaged test images are then contrasted with a reference image to identify differences, which indicate the presence of defects. The above-described methods and systems can be used to produce enhanced test and reference images.

One embodiment employs an image transformation in place of conventional averaging. The image transformation, defined below in equation 2, is applied to both a sequence of test images and a sequence of reference images. The resulting transformed test and reference images $I_T$ and $I_R$ are then contrasted to identify differences.

$$I = D\left(L\left(F\left(\frac{\sum_{i=0}^{n-1} D^{-1}(I^i)}{n}\right)\right)\right) \quad (2)$$

where:

1. $D^{-1}$ represents an image transformation (casting) from sixteen-bit numbers provided by frame grabber 325, each number representing the intensity of one pixel, to their floating-point inverses (quasi-inverse to D, below);
2. $I^i$ is the i-th image of the sequence;
3. n is the number of images in the sequence;
4. F represents image filtering, e.g. low-pass filtering to reduce noise and eliminate data provided by defective pixels in IR detector 315;
5. L is the application of a look-up table to the image to translate the range of intensity values to a different scale, e.g., a different range or from linear to quadratic; and
6. D is an image transformation (casting) from floating-point values to sixteen-bit numbers.

In carrying out the image transformation of equation 2 on a sequence of images (test or reference), each pixel intensity value in each of the sequence of images is converted to a floating-point number. The resulting image arrays are then averaged, on a per-pixel basis, to combine the images into a single image array. Next, the resulting image array is filtered to reduce the effects of noise and to remove data associated with defective pixels in the imaging device. Each datum associated with a defective pixel, identified by an extreme intensity value, is replaced with a new intensity value interpolated from data representative of neighboring areas.

The intensity values of the combined, filtered image array are applied to a look-up table that translates the range of intensity values to a different scale, e.g., a different range or from linear to quadratic. Finally, the values in the resulting translated image array are converted back from floating-point numbers to digital numbers to produce the transformed image I.

The image transformation of equation 2 is applied to a series of test images and a series of reference image to produce respective combined test and reference images $I_T$ and $I_R$. The test and reference images $I_T$ and $I_R$ are then contrasted, using well-known image processing techniques, to produce a composite image. The composite image highlights temperature differences between the test and reference images; unexpectedly warm or cool areas are indicative of defects.

In general, short circuits produce relatively high currents, and consequently grow relatively hot. Open circuits reduce current, remain relatively cool, and are therefore more difficult to image using IR thermography. The improved thermal contrast provided by the foregoing embodiments allows sensitive IR detectors to capture images that highlight many types of defects previously difficult or impossible to view with conventional IR thermography. Such defects include open circuits of the type depicted in FIG. 2. The image transformation of equation 2 further enhances the results.

Figure 6C:
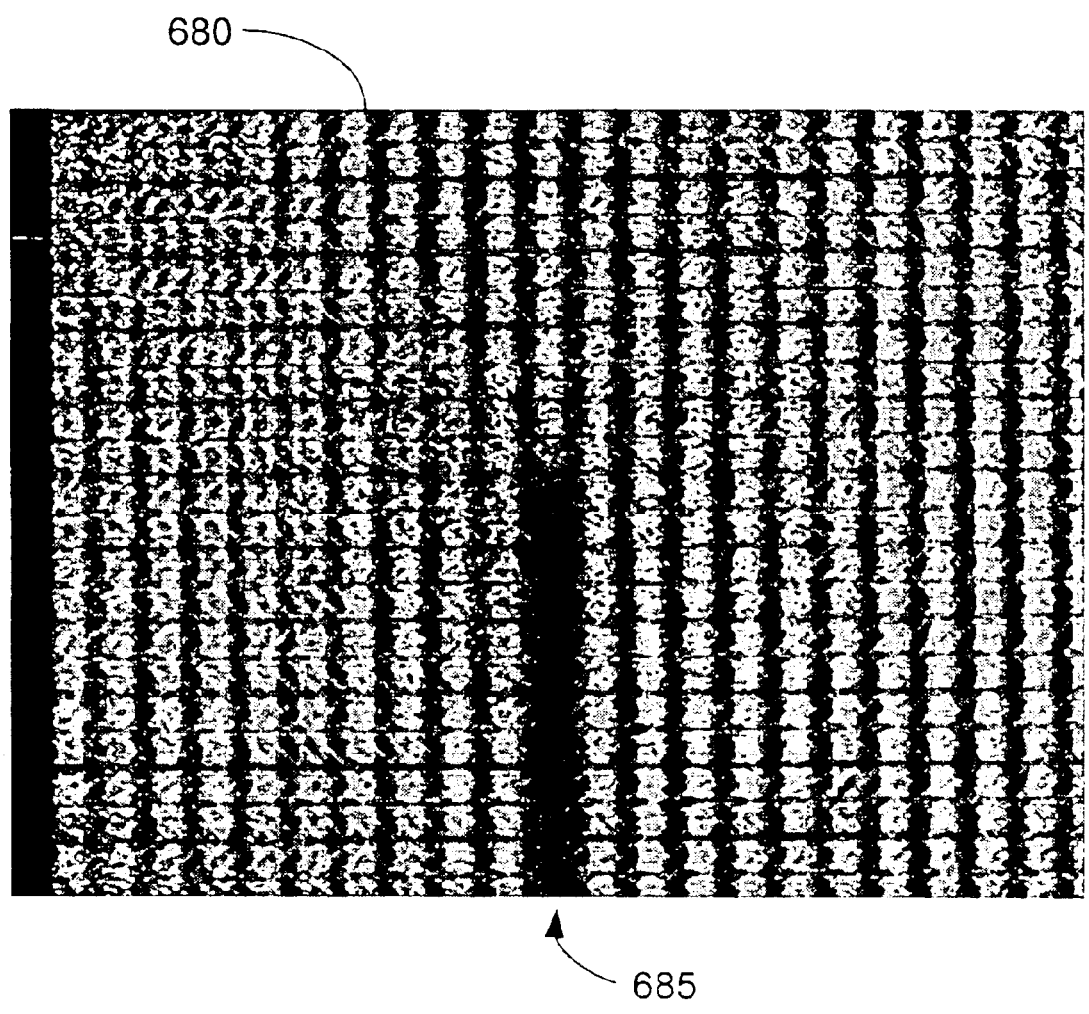
FIG. 6C depicts an experimentally obtained image 680 highlighting a line 685 indicative of an open.

FIG. 6C depicts an experimentally obtained image 680 illustrating how the above-described embodiments produce sufficient thermal contrast to highlight opens. A line 685 represents a relatively cool defect artifact resulting from the presence of an open.

Defect-location Algorithms

A short between two lines increases current through those lines, and consequently elevates the temperatures of the lines. Thus the lines, though not themselves defective, may nevertheless appear in the composite image. The portion of the composite image highlighting the lines is termed the "defect artifact" of the short. Opens block current, and consequently reduce the temperature of associated features. These features then appear in the composite image as a "defect artifact" of the open. (FIG. 6C depicts a line-type defect artifact associated with an open). Test images thus include defect data spatially correlated to the defect region and defect-artifact data spatially correlated to defect-free regions of the imaged object. Unfortunately, defect-artifact data can obscure defect data during image analysis, rendering it difficult to precisely locate defects. Image-processing algorithms in accordance with some embodiments analyze the defect data and defect-artifact data to address this problem. (In the context of images, a related collection of defect data may be referred to as a "defect," for brevity; likewise, defect-artifact data may be termed "defect artifacts." Whether the term "defect" or "defect artifact" refers to a physical feature of an imaged object or image-data representative of a physical feature will be clear from the context.)

Figure 7:
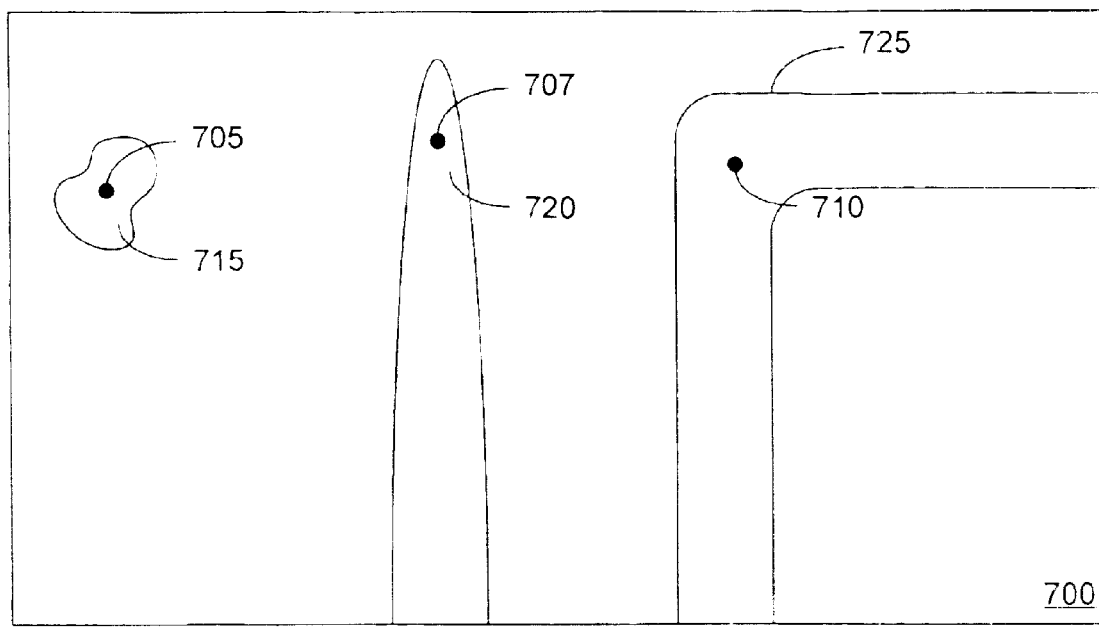
FIG. 7 depicts a composite image 700 showing three representative defects, a point-type defect 705, a line-type defect 707, and a corner-type defect 710.
Figure 8:
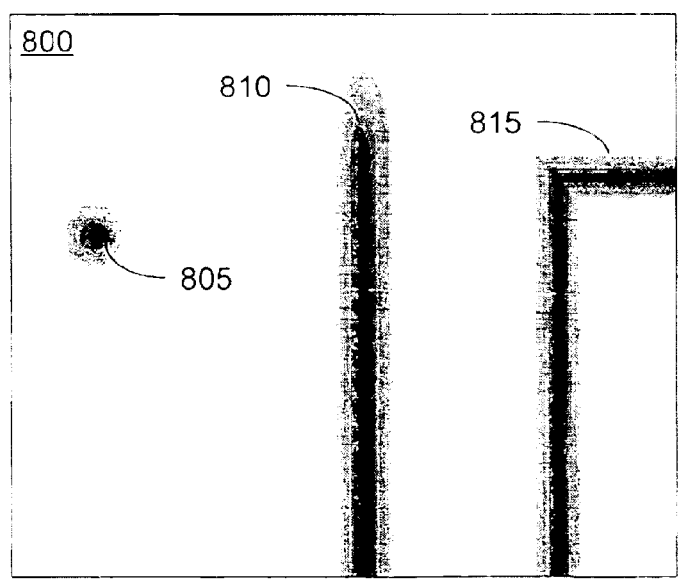
FIG. 8 is a composite image 800 exhibiting a point-type defect 805, a line-type defect 810, and a corner-type defect 815.

FIG. 7 depicts a composite image 700 showing three representative defects, a point-type defect 705, a line-type defect 707, and a corner-type defect 710. These defects are assumed to be of similar size, but the defect images nevertheless differ due to their respective defect artifacts 715, 720, and 725. Unfortunately, actual composite IR images do not so clearly distinguish defects from defect artifacts, rendering difficult the task of precisely locating defects. FIG. 8, though not based on measured data, more accurately depicts a composite image 800 illustrating how a point-type defect 805, a line-type defect 810, and corner-type defect 815 might appear in a composite image. The defect artifacts obscure the location of the defects. One embodiment addresses this problem, distinguishing defects from defect artifacts to facilitate defect detection, location, and analysis.

Image processing to distinguish a defect from the associate artifact is based, in part, on classifying defect-artifact data. Processing differs, for example, for point-type, line-type, and corner-type defects. Embodiments of the invention therefore include image-processing techniques that sort defect artifacts by type. Image-processing techniques that classify artifacts by type include pattern recognition and morphological analysis. The "Handbook of Image and Video Processing," edited by Al Bovik (2000) and "Nonlinear Filters for Image Processing," edited by E. Dougherty and J. Astola (1999) describe image processing and mathematical morphology known to those of skill in the art and suitable for use in some embodiments: these texts are incorporated herein by reference.

Figure 9:
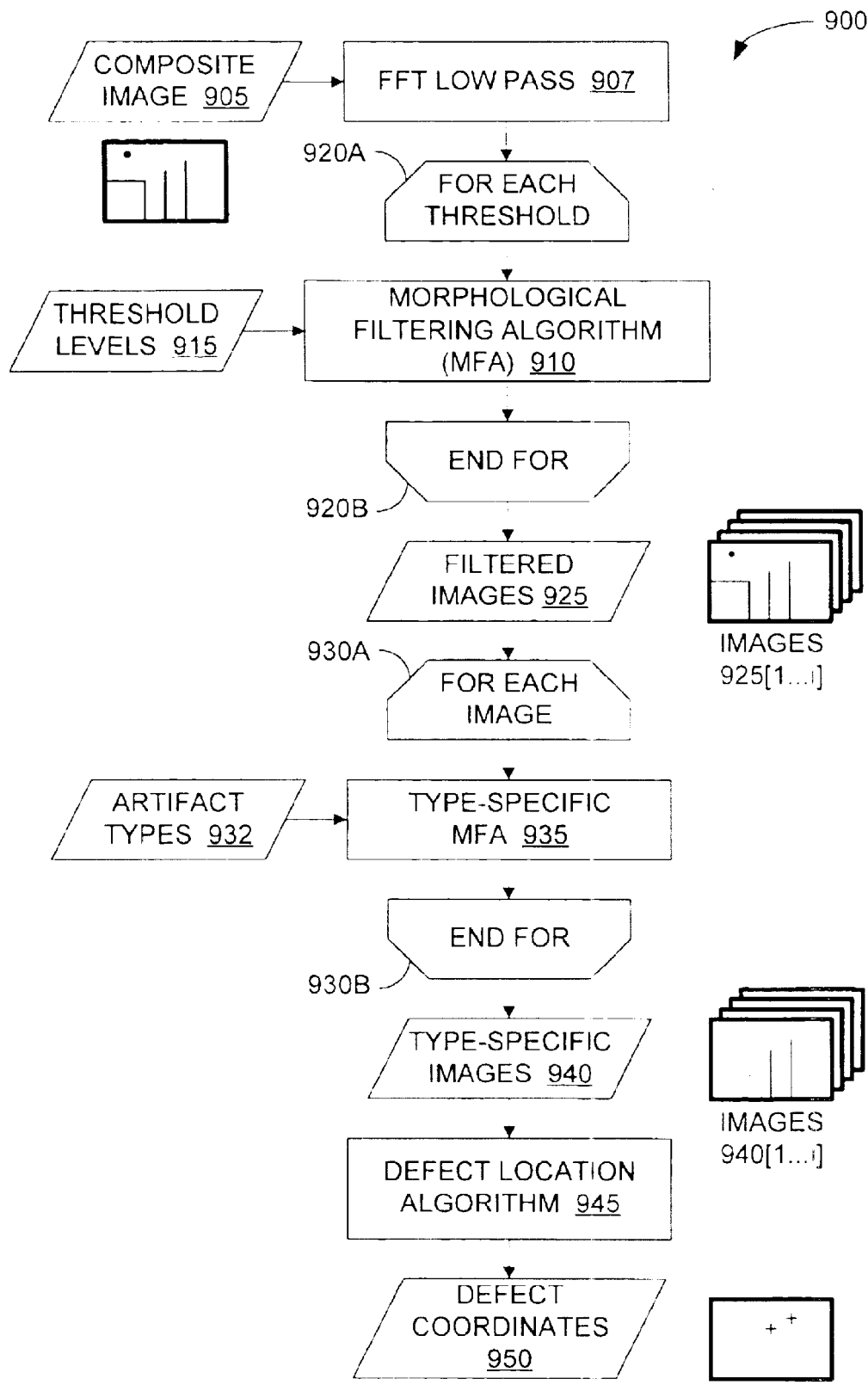
FIG. 9 is a flowchart 900 depicting a defect-location algorithm 900 in accordance with one embodiment.

FIG. 9 is a flowchart depicting a defect-location algorithm 900 in accordance with one embodiment. Algorithm 900 receives a composite image 905, optionally filtered using a fast-Fourier-transform (FFT) low-pass filter (step 907), in which defect data is bounded by defect-artifact data. Subsequent processing automatically locates the defect data within the defect artifacts to produce a list of defect coordinates. In one embodiment, composite image 905 is an IR composite image of the type discussed above; however, many other types of images depict subjects of interest surrounded by artifacts of those subjects. Algorithms in accordance with the invention can be used to localize such subjects. For example, images obtained from visual optics and/or nuclear-type experiments depict subjects and subject-artifacts.

The above-referenced Bovik reference describes a connection between gray-level and binary morphology that is used in some embodiments to distinguish defects from their associated artifacts. This connection is based on the observation that an image $I(x), x \in D$ can be reconstructed from the set of thresholds. Such reconstruction may be expressed mathematically as follows:

$$\Theta_v(I) = \{x \in D : I(x) \geq v\}, -\infty < v < \infty \quad (3)$$

where $\Theta_v(I)$ is the threshold of a grayscale composite image I with a threshold level v, and $D \subset \Re^2$ is the domain of the image:

$$I(x) = \sup_{v \in R} \{x \in \Theta_v(I)\} \quad (4)$$

Algorithm 900 employs a similar type of image reconstruction to define and optimize threshold levels to yield improved defect localization.

A morphological filtering algorithm (MFA) 910 is applied to the filtered composite image for each of a number of threshold levels 915. The repetition of MFA 910 for each threshold level, illustrated by bounding MFA 910 within a for-loop 920A and 920B, produces a set of i thresholded composite images 925[1 . . . i]. In each image 925, all pixel values of the filtered composite image greater than or equal to the applied threshold level are expressed using one logic level (e.g., logic one) and all pixel values less than threshold level 915 are expressed using a second logic level (e.g., logic zero). In one embodiment, threshold levels 915 are in units of standard deviation of pixel-intensity values from a filtered composite image produced by filter 907. Histogram analysis is provided to calculate mean $\mu$ and standard deviation g; the actual level of threshold is equal to $\mu + \sigma \cdot T$, where T is the input threshold level in units of $\sigma$. MFA 910 is detailed below in connection with FIG. 10.

The next for-loop (930A and 930B) treats each image 925 to a second MFA 935, this one type-specific. For line-type artifacts, for example, MFA 935 removes other types of defect artifacts (e.g., corner- and point-type artifacts), leaving only lines. For-loop 930 produces a set of i images, each having j line-type artifacts. In the illustration, the top image 940[1] includes two line-type defects: the point- and corner-type defects of image 925[1] are removed. The remaining images 940[2 . . . i] may have more or fewer artifacts. MFA 935 is detailed below in connection with FIG. 11.

In a final sequence of operations, a defect-location algorithm DLA 945 analyzes the defect artifacts in images 940 to precisely identify the defect coordinates 950 from among the defect artifacts. A version of DLA 945 specific to line-type defects is detailed below in connection with FIG. 12.

Figure 10:
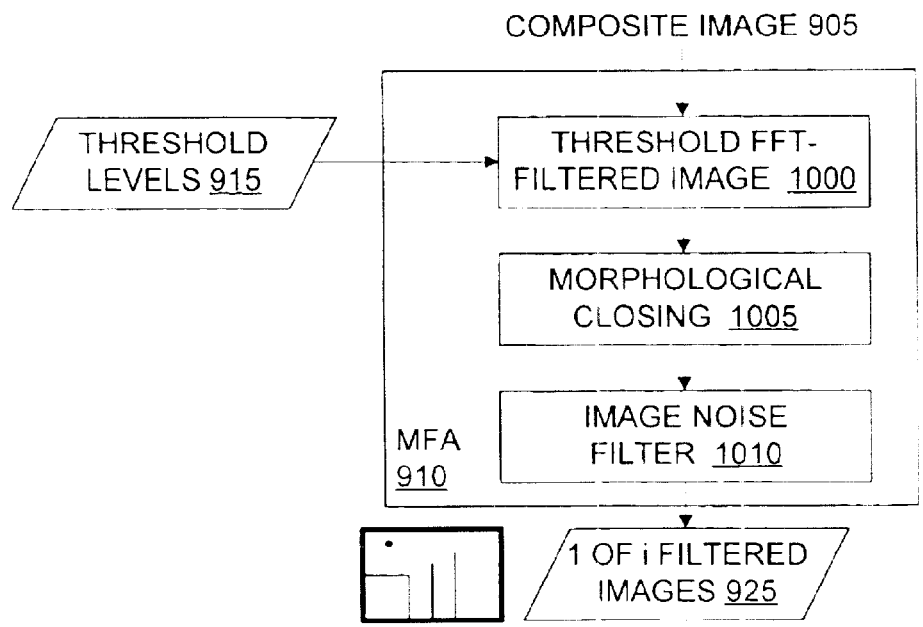
FIG. 10 depicts an embodiment of MFA 910 of FIG. 9.

FIG. 10 depicts an embodiment of MFA 910 of FIG. 9, which is repeatedly applied to composite image 905 to produce a sequence of i filtered images 925. First, one of threshold levels 915 is applied to the FFT-filtered composite image 905 (step 1000). A morphological closing step 1005 (a dilation followed by an erosion) applied to the product of step 1000 smoothes defect artifacts, and a subsequent filter removes small image effects induced by noise or defective detector pixels (step 1010). MFA 910 thus produces one of the i images 925[1 . . . i]. MFA 910 is repeated, as shown in FIG. 9, for each one of threshold levels 915.

Figure 11:
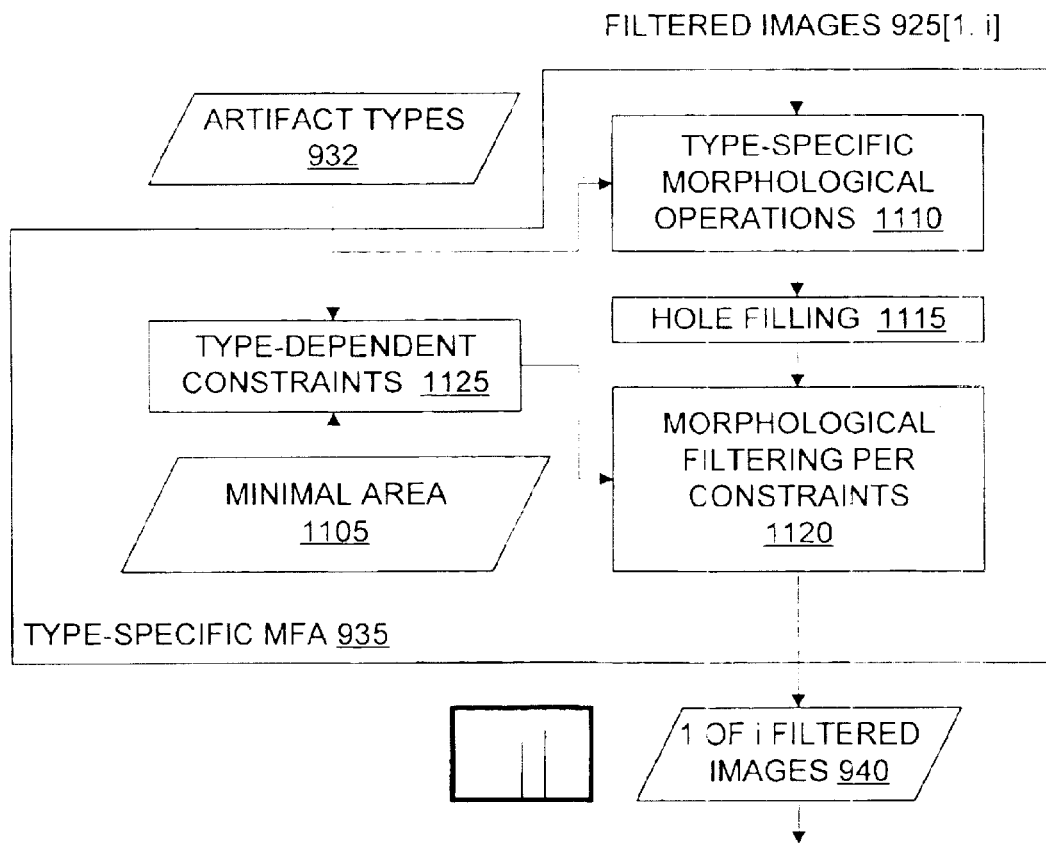
FIG. 11 depicts an embodiment of type-specific MFA 935 of FIG. 9 adapted for use with line-type defect artifacts.

FIG. 11 depicts an embodiment of type-specific MFA 935 of FIG. 9 adapted for use with line-type defect artifacts. MFA 935 receives filtered images 925 from MFA 910 and employs type-specific filtering operations that remove any artifacts other than line-type artifacts. Step 1110 provides type-specific morphological operations based on an artifact's position on the image rather than its geometrical properties. For example, an artifact located in areas where that type of artifact is not expected may be eliminated. Any holes in the surviving artifacts are then filled (step 1115) using any of a number of conventional hole-filling techniques.

Next, step 1120 filters the images from step 1115 using a type-dependent list of constraints 1125 derived from artifact type and area information. Constraints 1125 are a type-specific list of measurable artifact parameters and ranges. For example, line-type artifacts in simple cases may be filtered out by their circular factor ("lines" are not circular), orientation (e.g., line-type artifacts must be close to vertical or horizontal), and their edge intersections (e.g., line-type defects, distinct from corner-type defects, do not interest two adjacent image boundaries). The resulting filtered binary image 940 contains only the desired type of artifact. In one embodiment, image 940 has two pixel values: background (0) and artifact (1). The artifacts appear as areas of touching pixels, all set to 1; the surrounding areas appear as pixels set to 0. The details of the implementation of each block of MFA 900 are well known to those of skill in the art of image processing. MFA 935 is repeated, as shown in FIG. 9, for each one of threshold levels 915.

The set of morphological operations applied in MFA 935 is specific to line-type defects in the example, but these operations can be modified as desired to accommodate e.g. point- and corner-type defects. If only point-type artifacts were of interest, MFA 935 can be adapted to remove the artifacts that touch the border of the image, artifacts greater than a specified maximum area, etc., which would correspond to line-, corner-, and other type artifacts. If only corner-type artifacts were of interest, MFA 935 can be adapted to remove artifacts that do not represent intersecting perpendicular lines of a specified minimum area, etc. MFA 935 can be modified to select these and other types of artifacts using well-known image-processing techniques.

Figure 12:
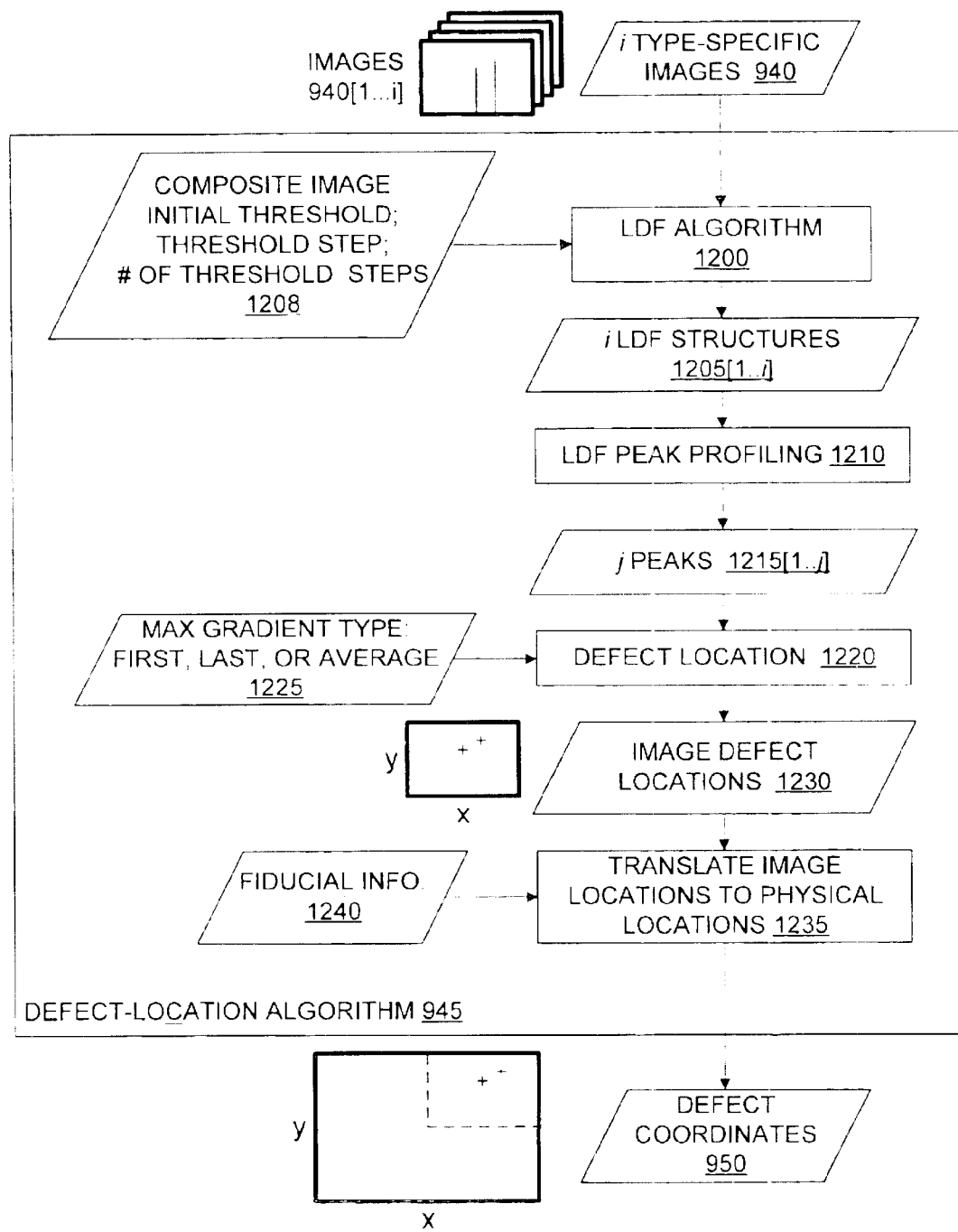
FIG. 12 depicts an embodiment of defect-location algorithm (DLA) 945 of FIG. 9.

FIG. 12 depicts an embodiment of defect-location algorithm (DLA) 945 of FIG. 9, which generates a list of physical coordinates for defects on an object under test using the array 940 of type-specific images. DLA 945 is specific to line-type defect artifacts, but can be adapted for use with other types of defects, as will be evident to those of skill in the art.

In the first step, a line-defect filter LDF algorithm 1200 produces an array of i LDF structures 1205[1 . . . i], one LDF structure for each image 940. In addition to type-specific images 940, LDF algorithm 1200 receive as inputs 1210 the original filtered composite image (from step 907 of FIG. 9), the value of the initial threshold level used to create images 940, a threshold step value indicative of the difference between threshold values used to acquire successive images, and the number i of threshold levels (the number of threshold levels i is the same as the number of images 940 because 940 are thresholded images).

Figure 13:
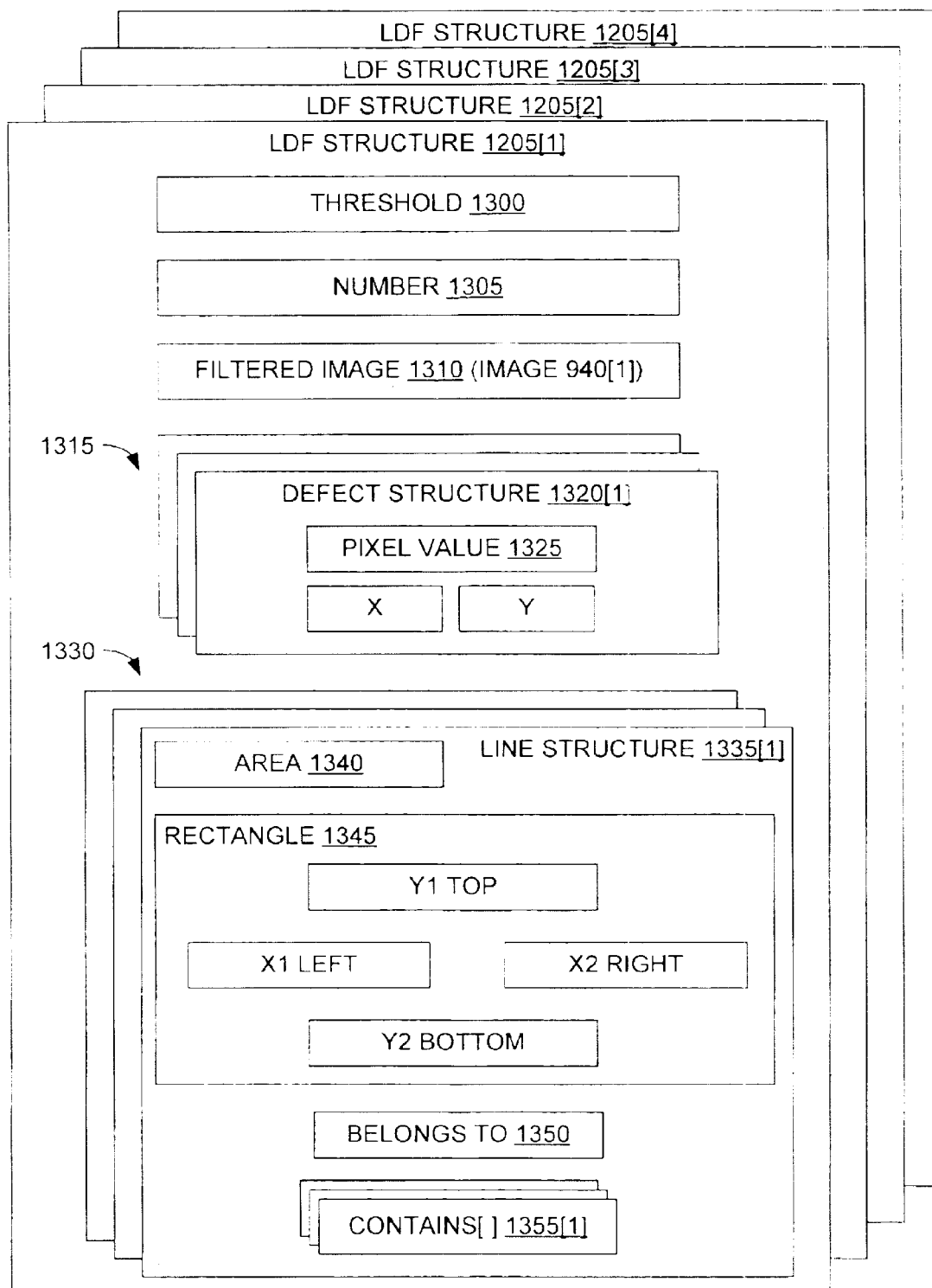
FIG. 13 depicts an array of LDF structures 1205 in accordance with one embodiment.

FIG. 13 depicts a linked-list array of LDF array structures 1205 (FIG. 12) in accordance with one embodiment. In this example, four threshold levels and associated processing are used to produce four LDF structures 1205[1] through 1205[4], though the actual number of arrays can be more or fewer. These arrays are adapted for use with line-type defect artifacts, but can be modified for use with other types. Each LDF structure 1205[i] includes the below-listed features.

1. A threshold field 1300 that stores the threshold level applied to the composite image to produce the respective binary image 940[i].
2. A number field 1305 that stores the number n of identified defects, two in the example of FIG. 12.
3. An image field 1310 that stores the respective binary image 940[i].
4. An array 1315 of defect structures 1320[1-j], where j is the number of defect artifacts in the respective image 940[i]. Each defect structure 1320 stores the X and Y coordinates of the pixel at the tip, or "peak," of the respective line-type defect artifact (defects are assumed to be near the tip of line-type defect artifacts). Each defect structure additionally includes a pixel-value field 1325 that stores the pixel intensity value corresponding to the X and Y coordinates of the peak pixel in composite image 905.
5. An array 1330 of line structures 1335[1-j], each associated with a defect artifact in the respective filtered image 940[i]. Each line structure 1335 includes an area field 1340 that stores the area of the defect artifact (in pixels); a rectangle field 1345 that stores the left, top, right, and bottom coordinates of a rectangle encompassing the defect artifact; a belongs-to field 1350 that stores a line index relating a line-type artifact to features of an image taken at a lower threshold level (−1 of no such line exists); and a contains field 1355 that stores an array of line indices relating a line-type defect in the filtered image with one or more related lines in another filtered image taken at a higher threshold level. The purposes of Belongs-to field 1350 and contains field 1355 are detailed below in connection with FIGS. 14 and 15A–D.

Returning to FIG. 12, a LDF structures 1205[1 . . . i] are analyzed (step 1210) to develop j LDF gradient peak profiles 1215[1 . . . j], one for each type-specific defect artifact in each image 940. The following discussion of FIGS. 14, 15A–15D, and 16 illustrates the process of peak profiling 1210.

Figure 14:
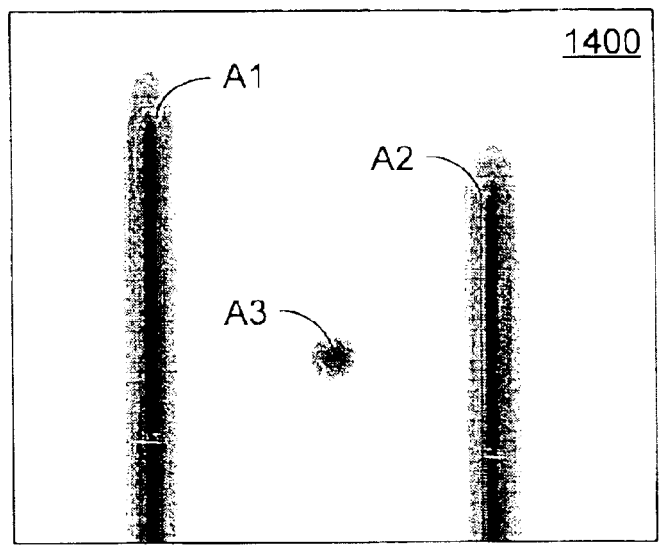
FIG. 14 depicts an illustrative filtered composite image 1400 similar to what one might expect from step 907 of FIG. 9.

FIG. 14 depicts an illustrative filtered composite image 1400 similar to what one might expect from step 907 of FIG. 9. Image 1400 includes a pair of vertical line-type defect artifacts A1 and A2 and a point-type artifact A3. The boundaries of the defect artifacts are blurred to depict the lack of an emphatic image boundary between defect- and defect-artifact data. It is assumed, however, that defects associated with line-type defect artifacts are near artifact tips, or "peaks," and defects associated with point-type defects are centered within the related artifact.

FIGS. 15A-15D depict binary, type-specific images 1505, 1510, and 1515 like images 940[1 . . . i] of FIG. 9. Each image represents composite image 1400 with a distinct applied threshold value, per MFA 910; point-type artifact A3 is removed from each binary image by the subsequent application of type-specific MFA 935. Each image is stored in field 1310 of an LDF structure 1205 (FIG. 13) along with the other image- and artifact-specific information described above in connection with FIG. 13.

Figure 15A:
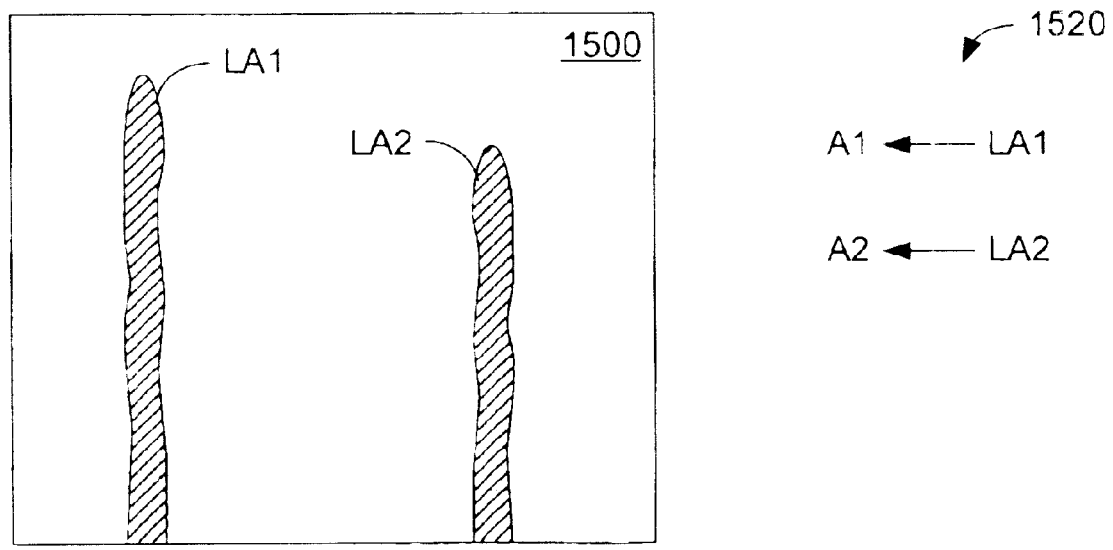
FIGS. 15A–15D depict binary, type-specific images 1505, 1510, and 1515 like images 940[1 . . . i] of FIG. 9.
Figure 15B:
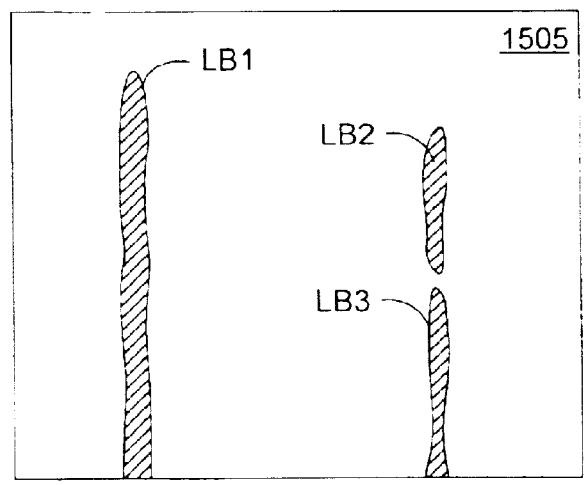
Figure 15C:
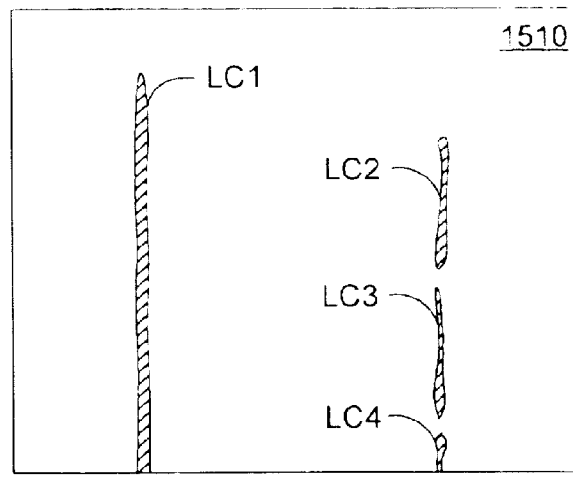
Figure 15D:
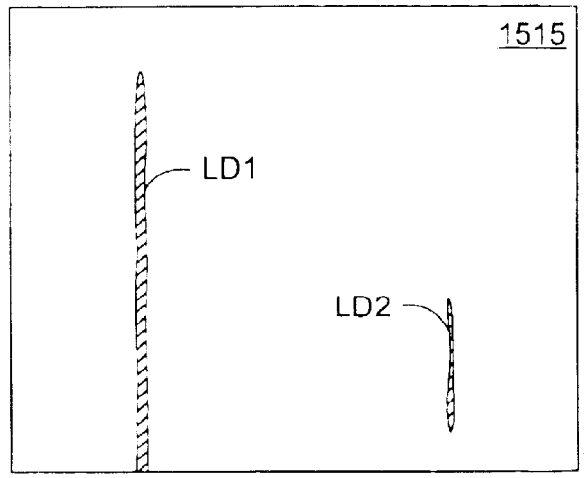

Image 1500 (FIG. 15A) includes a pair of line artifacts LA1 and LA2. A related key 1520 identifies artifacts LA1 and LA2 as corresponding to respective artifacts A1 and A2 of FIG. 14. As threshold levels increase, line-type artifacts become smaller and thinner, and may disappear or split into several disconnected lines. In FIG. 15B, for example, the defect artifact LA2 depicted as a single line in FIG. 15A appears as a pair of line artifacts LB2 and LB3. A key 1525 identifies artifact LB1 as belonging to artifact LA1 of image 1500 and artifacts LB2 and LB3 as belonging to artifact LA2 of image 1500. This artifact "ownership" is recorded in the "belongs to" field 1350 of the LDF array associated with image 1505; similarly, the "contains" field 1355 of the LDF array associated with image 1500 notes that artifact LA1 "contains" artifact LB1 and artifact LA2 contains artifacts LB2 and LB3. FIGS. 15C and 15D include different collections of defect artifacts and respective keys 1530 and 1535 illustrating the "belongs to" relationship between artifacts in the various images.

Figure 16:
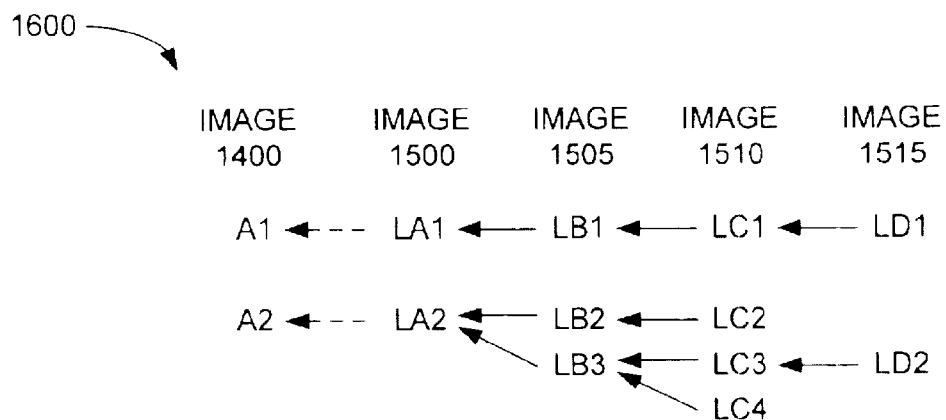
FIG. 16 depicts a tree 1600, a compilation of the information in keys 1525, 1530, and 1535 of FIGS. 15B–D.

FIG. 16 depicts a tree 1600, a compilation of the information in keys 1525, 1530, and 1535 of FIGS. 15B-D. Tree 1600 illustrates the relationship between defect artifacts A1 and A2 and the line-type artifacts in binary images taken using successively greater threshold levels. For example, artifact LD2 of image 1515 belongs to artifact LC3 of image 1510, which belongs to artifact LB3 of image 1505, which belongs to artifact LA2 of image 1500. Likewise, artifact LD1 of image 1515 belongs to artifact LC1 of image 1510, which belongs to artifact LB1 of image 1505, which belongs to artifact LA1 of image 1500.

Figure 17:
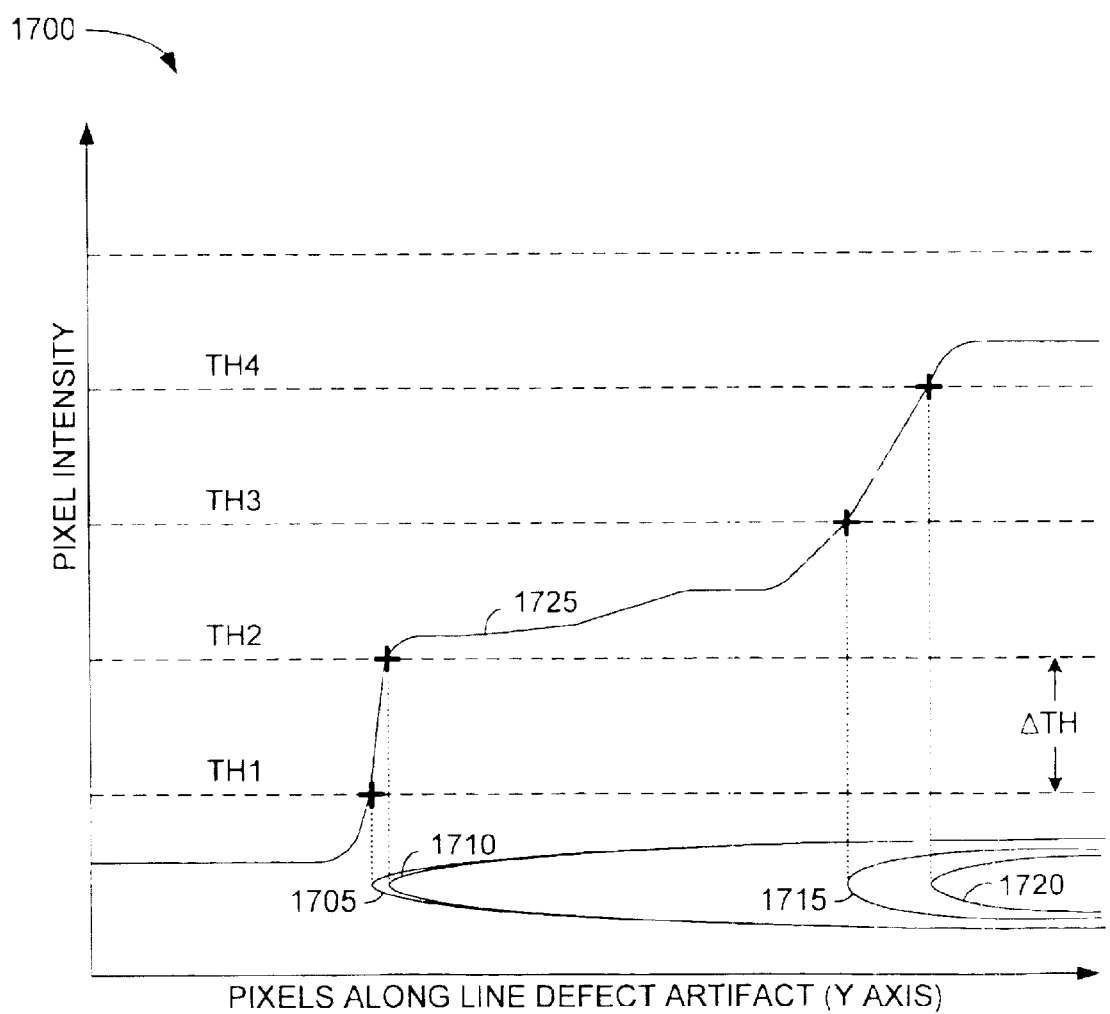
FIG. 17 is an illustrative peak profile 1700 showing the relationship between four defect artifacts 1705, 1710, 1715, and 1720.

Returning briefly to FIG. 12, LDF gradient peak profiling step 1210 uses the data depicted in FIGS. 15A–15D to produce j peak profiles 1215[1 . . . j], one profile for each defect. FIG. 17 is an illustrative peak profile 1700 showing the relationship between four defect artifacts 1705, 1710, 1715, and 1720, all of which relate to a common defect artifact. Profile 1700 expresses a relationship between the threshold level and the placement of the peak pixel in each defect artifact along the y image axis. A plot 1725 of Pixel intensity along a slice of pixels in parallel with a bisecting the line-type defect artifact of a grayscale image illustrates how pixel intensity generally increases as the defect artifact is encountered. Artifacts 1705, 1710, 1715, and 1720 represent slices of plot 1725 taken at four threshold levels. The bold "+" signs indicate the y locations of the peak (tip) pixels of the respective defect artifacts for different threshold levels.

Returning to FIG. 12, locating step 1220 extracts from the LDF arrays data of the type represented in FIG. 17 to produce a number of two-dimensional arrays, each with first dimension DIMi (the number of threshold levels) and second dimension DIMj (the number of artifacts in the image thresholded at the lowest level, it is the size of array 1320 of LDF structure 1205[1]). These arrays are as follows (the formal definitions are given below in pseudocodes:

1. y[j,i] is y-coordinate of defect structure 1320[j] of LDF structure 1205[i], it specifies the defect related to the j-th artifact of the image 1310 thresholded at the level i;
2. Line[j,i] is the index of the line that contains defect j at threshold level i (pseudocodes explain how the index is chosen; and
3. dy[j,i] is the difference between y values of defects 1320[j] from LDF structures 1205[i+1] and 1205[i].

For every artifact j, step 1515 performs the following initialization and loop:

Initialization: (for every j=1, . . . , Dimj):
  Line[j,1]=j;
  y[j,1]=LDF_Array[1].Defects[j].y
At threshold level #1 (initial threshold) all filtered lines are assumed to contain defects, so Line[j,1] is the index of the line and y[j,1] is the assumed y position of the defect associated with this line.
Iteration i: i=1, . . . , DIMi-1 (for every j)
/* i-threshold index; j-index of the line 1335 from LDF structure 1205[1] corresponding to the lowest threshold level.
*/

1. $k_{opt}$=argmin$_k$ {
   LDF_Array[i+1].
   Defects[
      LDF_Array[i].Lines[Line[j,i]].Contains[k]].y,
   }
2. Line[j,i+1]=LDF_Array[i].Lines[Line[j,i]].Contains [$k_{opt}$]
3. y[j,i+1]=LDF_Array[i+1].Defects[Line[j,i+1]].y
4. dy[j,i]=y[j,i+1]-y[j,i]

In steps 1 and 2 above, for a chosen line[i,j] of threshold level i, the line for the next threshold level (i+1) belongs to line[j,i]. Among the lines of the threshold level (i+1) belonging to line[j,i], the line with the lowest y value is chosen as the line most likely to include the defect (the y axis of each image goes from top to bottom, so the lowest y value represents the highest point). After choosing the line Line [j,i] with the lowest y value, the y value for the defect associated with this line is taken from the corresponding line structure. The value dy[j,i] defined at step 4 of the foregoing pseudocode is used below to define the LDF gradient When line defects have been presented by trees of artifacts, as depicted in FIG. 16, and LDF gradient peak profiling has been made, the ends of the lines associated with defects (upper ends according to assumption made above) are defined as maxima of LDF gradients. The LDF gradient for each threshold level index i is defined by $$LDF\mathrm{Grad}[j, i] = \frac{D_{Th}}{dy[j, i]} \quad (5)$$

where j is the defect index, i is the threshold level index, and $D_{Th}$ is the separation between threshold levels. $D_{Th}$ is a constant, so the following equality holds:

$$\max_i LDF\mathrm{Grad}[j, i] = \frac{D_{Th}}{\min_i dy[j, i]} \quad (6)$$

Further, because only the location of the maxima of LDF Gradients is used, the task of finding the maxima of LDF gradients is equivalent to searching for the minimal elements in the rows of array dy[ ] calculated by the LDF gradient peak profile algorithm 1210. In many cases the minimal dy is zero because the image location is measured in numbers of pixels, and with this level of granularity the y-location of the defect may be the same for neighboring threshold levels.

Sometimes there are several locations of minimal dy. The multitude of locations with maximal LDF gradients (minimal dy) requires calculation of the first and the last indexes of the minimal elements in the rows of array dy[ ]. The data structure of the type maxLDFGrad contains the following elements:

1. Threshold is the threshold level of the maximal LDF gradient;
2. Th.Ind. is index i of the threshold level;
3. Line Ind. is the line index j associated with the defect at this threshold level;
4. DY is the minimal value of the row of array dy[ ]; and
5. x and y are the coordinates of defect location.

Step 1220 employs an analysis of LDF gradient peak profiles 1215 to locate the defects associated with the line-type defect artifacts specified in the line structures of the LDF array. Step 1220 performs a calculation based on First and Last maxLDFGrad structures (input data 1225) corresponding to the first and the last indexes of the minimal elements in the rows of array dy. One or both structures are used to derive the corresponding defect location. The location can be defined as (x,y) from defect structure 1320[j] of LDF structure 1205[i] where j and i are taken from either First or Last maxLDFGrad structure. In the default case the defect location is midway between these two. The resulting list of defect locations 1230 accurately locates defects within line-type defect artifacts in the image.

The final step 1235 employs fiducial coordinates 1240 to translate the image coordinates 1230 into physical defect coordinates 950 (FIG. 9). For this purpose, the object under test is assumed to be aligned with the respective detector using fiducial marks, usually two of them.

The set of operations applied in DLA 945 is specific to line-type defects in the example, but these operations can be easily modified as desired to accommodate e.g. point- and corner-type defects. Defect-location algorithm 900 (FIG. 9) therefore locates various types of defects within their respective artifacts.

While the present invention has been described in connection with specific embodiments, variations of these embodiments will be obvious to those of ordinary skill in the art. For example, the methods and systems described above can be applied to many types of electrical circuits, including integrated circuits, printed-circuit boards, microelectromechanical systems (MEMS), semiconductor wafers, and some biomedical specimens. Moreover, while the IR inspection systems described above employ a combination of electrical excitation and thermography that produces thermal defect artifacts, other types of inspection systems employ other types of excitation and/or imaging, and consequently produce other types of defect artifacts. For example, some imaging systems acquire images using white light, combined spectroscopy, or magnetic fields. The embodiments described above for isolating defects from defect artifacts are not limited to IR inspection systems of the type described above. Therefore, the spirit and scope of the appended claims should not be limited to the foregoing description.

What is claimed is:

1. A test configuration comprising:
   a. a display panel including:
      i. a plurality of source lines;
      ii. a plurality of control lines;
      iii. a plurality of common lines;
      iv. a two-dimensional array of display elements, each display element including a transistor and a capacitor, wherein the transistor has a first current-handling terminal connected to one of the source lines, a second current-handling terminal, and a control terminal connected to one of the control lines, and wherein the capacitor has a first capacitor terminal connected to the second current-handling terminal and a second capacitor terminal connected to one of the common lines; and
      v. a defect amid surrounding features;
   b. an infrared detector positioned to receive infrared radiation from the display panel, including infrared radiation from the defect and surrounding features;
   c. a signal generator having:
      i. a first test-signal output terminal connected to at least one of the source lines;
      ii. a second test-signal output terminal connected to at least one of the control lines; and
      iii. a third test-signal output terminal connected to at least one of the common lines;
      iv. wherein the signal generator simultaneously applies a first test vector on the first test vector output terminal, a second test actor on the second test-signal output terminal, and a third test vector on the third test-signal output terminal;
      v. wherein application of the first, second, and third test vectors heats the defect and surrounding features; and
      vi. wherein the detector captures a thermal image of the heated display, the thermal image including defect data representative of the defect and defect-artifact data representative of the surrounding features; and
   d. an image processor analyzing the defect-artifact data to locate the defect data within the defect-artifact data.

2. The test configuration of claim 1, wherein at least one of the first and third test vectors is an AC signal.

3. The test configuration of claim 2, wherein the second test vector is a DC signal biasing on the transistor.

4. The test configuration of claim 1, wherein the second test vector turns the transistor on.

5. The test configuration of claim 1, wherein the signal generator applies a test vector across the source and common lines to develop a test current through the first and second current-handling terminals of the transistor.

6. A test configuration comprising:
   a. a display panel including:
      i. a plurality of source lines;
      ii. a plurality of control lines;
      iii. a plurality of common lines;
      iv. a two-dimensional array of display elements, each display element including a transistor and a capacitor, wherein the transistor has a first current-handling terminal connected to one of the source lines, a second current-handling terminal, and a control terminal connected to one of the control lines, and wherein the capacitor has a first capacitor terminal connected to the second current-handling terminal and a second capacitor terminal connected to one of the common lines;
   b. an infrared detector positioned to receive infrared radiation from the display panel; and
   c. a signal generator having:
      i. a first test-signal output terminal connected to at least one of the source lines;
      ii. a second test-signal output terminal connected to at least one of the control lines; and
      iii. a third test-signal output terminal connected to at least one of the common lines;
      iv. wherein at least one of the first and third test vectors is of a test frequency and encounters a resistance and a capacitance, and wherein the test frequency is matched to the capacitance and the resistance to provide maximum power transfer from the signal generator to the panel.

7. A test configuration comprising:
   a. an electrical circuit having at least one defect amid surrounding features and disposed within a defect region, the defect region having an initial temperature;
   b. an infrared detector positioned to receive infrared radiation from the defect region, including infrared radiation from the defect and surrounding features, wherein the detector captures a thermal image of the defect region, the thermal image including defect data representative of the defect and defect-artifact data representative of the surrounding features;
   c. a signal generator having at least one test-signal output terminal connected to the electrical circuit, the signal generator applying a test vector to the defect via the electrical circuit, wherein the defect exhibits a thermal response to the applied test vector; and
   d. an image processor analyzing the defect-artifact data to isolate the defect data within the defect-artifact data;
   e. wherein the infrared detector captures an image of the defect after application of the test vector and before the defect reaches 95% of a difference between the initial temperature and a final equilibrium temperature.

8. The test configuration of claim 7, wherein the infrared detector captures the image before the defect reaches about 86.5% of the difference.

9. The test configuration of claim 7, wherein the infrared detector captures the image before the defect reaches about 63.5% of the difference.

10. The teat configuration of claim 7, wherein the signal generator includes a second test-signal output terminal, the electrical circuit comprising a transistor having a first current-handling terminal connected to the first-mentioned test-signal output terminal, a cortrol terminal connected to the second test-signal output terminal, and a second current-handling terminal.

11. The teat configuration of claim 10, wherein the test vector is an AC signal.

12. The test configuration of claim 11, wherein the signal generator applies a second test vector to the control terminal via the second test-signal output terminal.

13. The test configuration of claim 12, wherein the second test vector turns the transistor on.

14. The test configuration of claim 10, wherein the signal generator includes a third test-signal output terminal, the test configuration further comprising a capacitance connected between the second current-handling terminal of the transistor and the third test-signal output terminal.

15. A method for identifying a defect on an electrical circuit, the method comprising:
   a. applying test vectors, at a first instant, to the defect via the electrical circuit, wherein the defect exhibits a thermal response to the test vectors, the thermal response being characterized by a thermal time constant;
   b. capturing a thermal image of the electrical circuit, the thermal image including representations of the defect and a defect artifact, at a second instant separated from the first instant by less than three time constants; and
   c. analyzing the representation of the defect artifact.

16. The method of claim 15, wherein the second instant is separated from the first instant by less a than two time constants.

17. The method of claim 15, wherein the second instant is separated from the first instant by less a than one time constants.

18. The method of claim 15, further comprising repeating steps (a) and (b) at least twice to capture a plurality of thermal images.

19. The method of claim 18, further comprising capturing a reference image between ones of the plurality of thermal images.

* * * * *